United States Patent
Rathke et al.

(10) Patent No.: US 12,529,380 B2
(45) Date of Patent: Jan. 20, 2026

(54) ELECTRIC COOLANT PUMP

(71) Applicant: PIERBURG PUMP TECHNOLOGY GMBH, Neuss (DE)

(72) Inventors: Ronald Rathke, Doebeln (DE); Wolfgang Zacher, Doebeln (DE); Martin Fiedlschuster, Mittweida (DE); Markus Riedel, Brandis (DE); Steffen Henn, Schkoelen (DE); Toni Henke, Gruenhainichen-Borstendorf (DE)

(73) Assignee: PIERBURG PUMP TECHNOLOGY GMBH, Neuss (DE)

( * ) Notice: Subject to any disclaimer, the term of this patent is extended or adjusted under 35 U.S.C. 154(b) by 44 days.

(21) Appl. No.: 18/035,111

(22) PCT Filed: Nov. 9, 2020

(86) PCT No.: PCT/EP2020/081511
§ 371 (c)(1),
(2) Date: May 3, 2023

(87) PCT Pub. No.: WO2022/096135
PCT Pub. Date: May 12, 2022

(65) Prior Publication Data
US 2023/0407870 A1    Dec. 21, 2023

(51) Int. Cl.
*F04D 13/06*    (2006.01)
*F04D 29/42*    (2006.01)
(Continued)

(52) U.S. Cl.
CPC ....... *F04D 13/0626* (2013.01); *F04D 29/426* (2013.01); *F04D 29/5893* (2013.01); *F04D 29/628* (2013.01); *H05K 3/0058* (2013.01)

(58) Field of Classification Search
CPC .............. F04D 13/0626; F04D 29/426; F04D 29/5893; F04D 29/628; F04D 13/0686;
(Continued)

(56) References Cited

U.S. PATENT DOCUMENTS 5,932,065 A * 8/1999 Mitchell .............. H05K 3/3415
29/760
6,132,184 A    10/2000 Robertson et al.
(Continued)

FOREIGN PATENT DOCUMENTS

CN    108702839 A    10/2018
CN    111465861 A    7/2020
(Continued)

*Primary Examiner* — Donghai D Nguyen
(74) *Attorney, Agent, or Firm* — Norman B. Thot

(57) ABSTRACT

An electric coolant pump for providing an automotive cooling circuit with a coolant includes an electric motor to drive the electric coolant pump, a pump housing, a separating can, a printed circuit board, and permanently height-adjusted supporting elements. The separating can includes a substantially plane separating can bottom wall which lies in a cross plane, and a substantially cylindrical separating can shell which fluidically separates a wet zone from a dry zone. The printed circuit board is arranged substantially parallel to and not in direct contact with the separating can bottom wall so that an axial gap exists which is filled with a heat conductive means. The supporting elements axially support the plane printed circuit board. Each supporting element has a distal tip which is trimmed to define a height-constant axial gap having a nominal gap height between the printed circuit board and the separating can bottom wall.

4 Claims, 3 Drawing Sheets

(51) Int. Cl.
   *F04D 29/58*   (2006.01)
   *F04D 29/62*   (2006.01)
   *H05K 3/00*    (2006.01)

(58) Field of Classification Search
   CPC .... F04D 2230/18; H05K 3/0058; H05K 3/36; H05K 3/3415; Y10T 29/49128
   See application file for complete search history.

(56) References Cited

U.S. PATENT DOCUMENTS

| | | | |
|---|---|---|---|
| 9,366,259 B2 * | 6/2016 | Binder | F04D 29/5813 |
| 9,970,428 B2 * | 5/2018 | Kinoshita | H02K 5/04 |
| 11,629,729 B2 * | 4/2023 | Hueser | F04D 29/5806 |
| | | | 415/174.5 |
| 2017/0302124 A1 | 10/2017 | Ehrsam | |
| 2019/0343014 A1 | 11/2019 | Perales et al. | |
| 2020/0300896 A1 | 9/2020 | Tamura et al. | |

FOREIGN PATENT DOCUMENTS

| | | |
|---|---|---|
| EP | 2 947 324 A1 | 11/2015 |
| EP | 3 006 742 A1 | 4/2016 |
| EP | 3 232 543 A1 | 10/2017 |
| JP | 2009-144661 A | 7/2009 |

* cited by examiner

ELECTRIC COOLANT PUMP

CROSS REFERENCE TO PRIOR APPLICATIONS

This application is a U.S. National Phase application under 35 U.S.C. § 371 of International Application No. PCT/EP2020/081511, filed on Nov. 9, 2020. The International Application was published in English on May 12, 2022 as WO 2022/096135 A1 under PCT Article 21(2).

FIELD

The present invention is directed to an electric coolant pump and to a method of manufacturing thereof, in particular to an automotive electric coolant pump for providing an automotive coolant circuit with a liquid coolant.

BACKGROUND

Electric coolant pumps have become increasingly common in a cooling circuit of an internal combustion engine. The volumetric flow rate of the electric coolant pump can be controlled independently of the rotational speed of the internal combustion engine so that the electric coolant pump is controlled depending on the engine requirements and not on the engine speed.

Electric coolant pumps are alternatively used, for example, for cooling the accumulators as part of a drive system of an electric vehicle or a hybrid electric vehicle.

These high-performance electric coolant pumps generate a lot of heat; the power electronics of the brushless electric motor driving such an electric coolant pump in particular generate large heat amounts within the pump housing.

EP 3 232 543 A1 describes a drive system arrangement of an electronic coolant pump with a pump motor which is provided with a separating can for separating a wet zone from a dry zone. The brushless coolant pump is provided with commutator and power electronic components at a printed circuit board. The printed circuit board lies in a cross plane with a small distance to a bottom wall of the separating can. The separating can bottom wall surface transfers heat to the circulating coolant at the wet side of the separating can. The printed circuit board is axially supported by a static supporting means within the pump housing. The axial gap between the printed circuit board and the uneven separating can bottom wall is filled with a heat conductive paste to improve the heat transfer between the printed circuit board and the separating can. The different layer thicknesses of the heat conductive paste dehomogenizes the heat transfer between the printed circuit board and the separating can bottom wall.

The separating can and the supporting structure of the printed circuit board are subject to production-related dimensional variations so that the height of the axial gap in every manufactured pump is different.

SUMMARY

An aspect of the present invention is to provide a cost-effective electric coolant pump with an effective heat dissipation and a method for manufacturing the electric coolant pump.

In an embodiment, the present invention provides an electric coolant pump for providing an automotive cooling circuit with a coolant. The electric coolant pump includes an electric motor which is configured to drive the electric coolant pump, a pump housing which is defined by a pump housing body, a separating can, a plane printed circuit board, and at least three supporting elements each of which are permanently height-adjusted. The separating can comprises a separating can bottom wall which is arranged to be substantially plane so as to lie in a cross plane, and a separating can shell which is arranged to be substantially cylindrical and which is configured to fluidically separate a wet zone from a dry zone within the pump housing of the electric coolant pump. The plane printed circuit board comprises electronic components for driving the electric motor. The plane printed circuit board is arranged substantially parallel to and not in direct contact with the separating can bottom wall so that an axial gap is defined between the separating can bottom wall and the plane printed circuit board. The axial gap is filled with a heat conductive means. The at least three supporting elements are configured to axially support the plane printed circuit board. Each of the at least three supporting elements comprises a distal tip which has been trimmed to define a height-constant axial gap having a nominal gap height between the plane printed circuit board and the separating can bottom wall.

BRIEF DESCRIPTION OF THE DRAWINGS

The present invention is described in greater detail below on the basis of embodiments and of the drawings in which.

DETAILED DESCRIPTION

Figure 1:
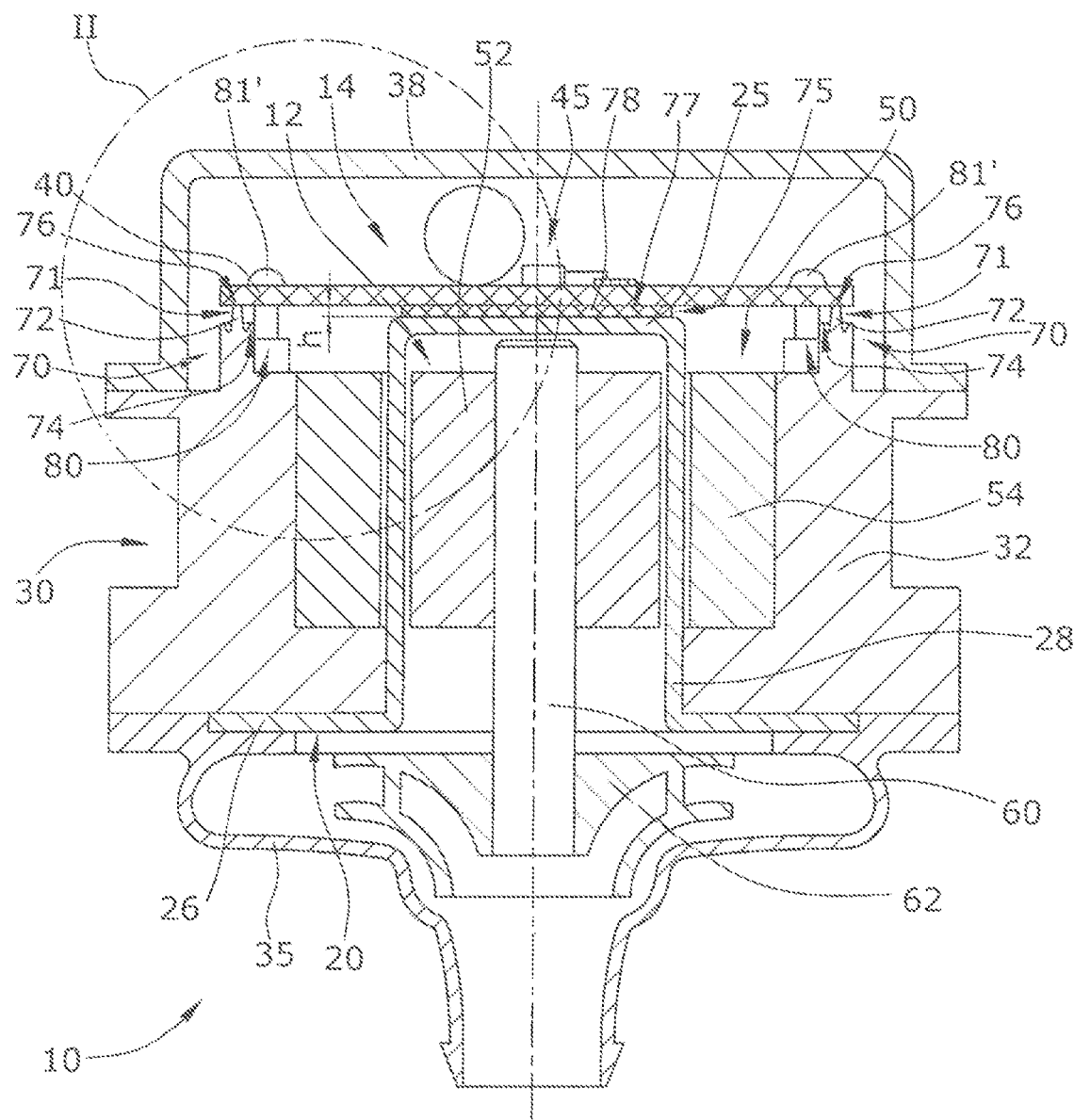
FIG. 1 shows an embodiment of an electric coolant pump with a height adjusted supporting element according to the present invention in a schematic cross-sectional view.

An electric coolant pump according to the present invention comprises an electric motor for driving the electric coolant pump, a pump housing with a pump housing body, and a separating can with a substantially plane separating can bottom wall and a substantially cylindrical separating can shell. The separating can fluidically separates a wet zone from a dry zone within the pump housing. A substantially plane separating can bottom wall is a separating can bottom wall surface of which the major part is defined by one plane surface. The separating can bottom wall can, however, be defined by two or more substantially parallel surfaces lying at different planes, for example, for reinforcing the separating can bottom wall. A substantially plane separating can bottom wall can alternatively be provided with reinforcement ribs.

The electric motor comprises a motor rotor and a motor stator, wherein the motor rotor and the motor stator are separated by the separating can. The motor rotor is arranged within the wet zone at the inside of the separating can shell and directly drives, for example, a rotor shaft with an impeller wheel. The motor stator is arranged concentrically to the motor rotor at the outside of the separating can shell so that the motor rotor in the wet zone is electromagnetically driven by the motor stator in the dry zone. The electric motor is accordingly brushless and therefore electronically commutated.

The electric coolant pump further comprises a substantially plane printed circuit board which is equipped with electronic components, for example, with electronic power semiconductors for electrically exciting the stator coils of the motor stator. The electronic components generate heat during the operation of the electric motor. The generated heat is transferred to the coolant circulating in the wet zone of the coolant pump and is thereby dissipated from the pump housing. The electric coolant pump therefore does not require a separate cooling circuit for cooling the electronic components.

The printed circuit board is arranged substantially parallel to the liquid cooled separating can bottom wall to create a heat sink which allows for a heat transfer between the printed circuit board and the circulating coolant via the separating can. The printed circuit board is not in direct contact with the separating can bottom wall. A small axial gap is thus defined between the separating can bottom wall and the printed circuit board, which small axial gap is filled with a heat conductive means, for example, with a heat conductive paste.

The heat conductive means is most effective if it is applied with a relatively small and substantially constant layer thickness, so that a height constant axial gap with a defined nominal gap height is required. The printed circuit board is supported by at least three height-adjusted supporting elements which can, for example, each be defined by a plastic supporting element body. The printed circuit board is supported in an axial orientation with at least three supporting elements. A distant arrangement of three separate supporting surfaces at the supporting elements' ends provides a statically determined system. The number of supporting elements can alternatively be smaller or larger than three, thereby accepting a statically indetermined system with a less precise spatial orientation of the printed circuit board.

Because of production-related dimensional variations of the separating can or the pump housing body, the axial position of the separating can bottom wall is slightly different in every manufactured pump. The nominal gap height is defined by the axial support of the printed circuit board at the permanently height-adjusted supporting element. The distal tip of every supporting element has been trimmed to a specific height before the assembly of the pump. The nominal gap height can therefore be individually adjusted to any type of deviation of the axial position of the separating can bottom wall from its nominal axial position.

The precisely adjusted and height-constant axial gap allows for a reliable heat dissipation by directly and constantly conducting the heat via the constant layered heat conductive means to the separating can bottom wall. The heat is convectively transferred from the bottom wall to the circulating coolant contacting the wet side of the separating can bottom wall, and is thereby transported away from the pump housing.

The adjusted axial gap allows for less exact manufacturing tolerances of the separating can and the supporting element because the distance between the supporting surface and the separating can bottom wall, which defines the axial gap height, is individually adapted and thereby normalized for every manufactured pump. This results in a cost reduction of the manufactured electric coolant pump.

In an embodiment of the electric coolant pump according to the present invention, the pump housing body can, for example, be made of a plastic material and the supporting element body can, for example, be an integral part of the pump housing body. The supporting element body can, for example, be molded or be casted in the plastic pump housing body. The effective heat dissipation within the pump housing, which prevents the pump housing from heat accumulations and thereby from overheating, allows the application of a plastic pump housing body to be provided. The use of plastic for the pump housing body therefore significantly reduces the production costs of the pump compared to a pump with a casted metal pump housing. The total weight of the pump is also reduced by the plastic pump housing.

In an embodiment of the present invention, the lateral position of the printed circuit board can, for example, be defined by at least one, for example, by at least two separate positioning pins. Each positioning pin reaches through a corresponding hole in the printed circuit board so that a lateral movement of the printed circuit board is avoided. The printed circuit board is radially positioned with the positioning pins so that a maximum overlapping of the heat transfer surfaces of both the separating can bottom wall and the printed circuit board is provided and a large heat transfer to the coolant is provided.

In an embodiment of the present invention, the head of each positioning pin reaching through the printed circuit board can, for example, be deformed, for example, by a thermal riveting process, to axially fix the printed circuit board in the axial direction opposite to the direction being supported by the supporting element, so that the printed circuit board is completely fixed within the pump housing.

In an embodiment of the electric coolant pump according to the present invention, the positioning pin can, for example, be arranged substantially centrically between two supporting elements. The two supporting elements are arranged adjacent and substantially equidistantly to the positioning pin. The printed circuit board is accordingly supported on two supporting elements in the first axial direction and is fixed in the second axial direction by the deformed head of the positioning pin. The supporting element and the positioning pin therefore define a supporting and fixing arrangement as an integral part of the pump housing body.

In an embodiment of the present invention, the supporting element body can, for example, be wedge-shaped or conical so that the cross-sectional area of the supporting element body tapers distally. The supporting surface of the supporting element body is therefore relatively small, while the supporting element body is structurally relatively strong.

In an embodiment of the present invention, the nominal gap height of the axial gap between the separating can bottom wall and the printed circuit board can, for example, be less than 1.0 mm. In an embodiment of the present invention, the axial gap can, for example, be less than 0.8 mm. A small axial gap between the separating can bottom wall and the printed circuit board reduces the layer thickness of the heat conductive means filling the axial gap. This results in a minimal application volume of the heat conductive means and thereby results in reduced material costs. The reduced layer thickness of the heat conductive means also results in a small total wall thickness so that the total thermal resistance of the different material layers is reduced and the heat transition is improved.

In an embodiment of the electric coolant pump according to the present invention, the supporting element can, for example, be surrounded by a collecting groove. The collecting groove collects melting material, in particular if the distal tip of the supporting element body is trimmed by a thermal process.

A method for manufacturing an electric coolant pump according to the present invention comprises at least three important process steps:

In a first manufacturing step, the electric coolant pump is in a pre-assembled state in which the printed circuit board is not mounted. In this pre-assembled state, the pump housing body and the separating can are already mounted together. The axial position of the separating can bottom wall is measured with respect to a reference point at the pump housing body, for example, with respect to each raw supporting element body.

In a second manufacturing step, each raw supporting element body is trimmed to a defined trimming height in relation to the measured axial position of the separating can bottom wall. The distance between the axial supporting surfaces of each supporting element body and the separating can bottom wall is substantially equal after all supporting element bodies have accordingly been trimmed.

In a third manufacturing step, the printed circuit board is assembled to the trimmed supporting element body. Due to the individual trimming of the supporting element, the axial gap is substantially constant and the opposing heat transfer surfaces of both the printed circuit board and the separating can bottom wall are substantially parallel.

An additional manufacturing step can, for example, be provided before the assembly step, i.e., before inserting the printed circuit board into the pump housing, the separating can bottom wall or the printed circuit board is provided with a heat conductive means. The applied heat conductive means, for example, a heat conductive paste, fills the axial gap between the printed circuit board and the separating can bottom wall after the printed circuit board has been mounted onto the supporting element. The heat transfer between the printed circuit board and the separating can bottom wall is thereby increased.

The supporting element can, for example, be trimmed by machining the raw supporting element body. The supporting element body is thereby mechanically trimmed, for example, by milling or by ultrasound-cutting, which causes a relatively low heat input to the supporting element.

The supporting element can alternatively be trimmed by thermally processing the raw supporting element body. The supporting surface of the supporting element body can, for example, be hot-formed. The material is thereby melted and can, for example, be collected by the surrounding groove so that no cutting chips are produced during the trimming method step.

In a manufacturing method of the electric coolant pump according to the present invention, the material removal during the trimming method step of every supporting means body can, for example, be at least 0.1 mm. The distal end of every supporting element body is thereby provided with a substantially plane supporting surface at a defined distance to the separating can bottom wall to provide a constant axial gap between the printed circuit board and the separating can bottom wall.

An embodiment of the present invention is described below with reference to the drawings.

An embodiment of the electric coolant pump 10 is shown in FIG. 1. The electric coolant pump 10 comprises a static pump housing 30 which is defined by a plastic pump housing body 32, a volute-shaped pump cover 35, and a motor cover 38. The electric coolant pump 10 further comprises a metallic pot type separating can 20 with a plane and disc-shaped separating can bottom wall 25, a cylindrical separating can shell 28, and a ring-shaped separating can flange 26. The separating can 20 fluidically separates a wet zone 12 from a dry zone 14 within the pump housing 30 of the electric coolant pump 10.

The electric coolant pump 10 is driven by a brushless electric motor 50 having a cylindrical motor rotor 52 which is concentrically arranged to the separating can shell 28 in the wet zone 12 at the radial inside of the separating can 20. The motor rotor 52 is co-rotatably connected to an impeller wheel 62 via a rotatable rotor shaft 60. The rotor shaft 60 is rotationally supported by bearings (which are not shown in the drawings). The brushless electric motor 50 comprises a substantially cylindrical motor stator 54 which is concentrically arranged to the separating can shell 28 in the dry zone 14 at the radial outside of the separating can 20, and thereby surrounds the separating can shell 28 and the motor rotor 52 in the wet zone 12. The motor stator 54 in the dry zone 14 electromagnetically drives the motor rotor 52 in the wet zone 12 by exciting the stator coils (which are not shown in the drawings) and electronically commutates the magnetic field of the stator coils.

Figure 2:
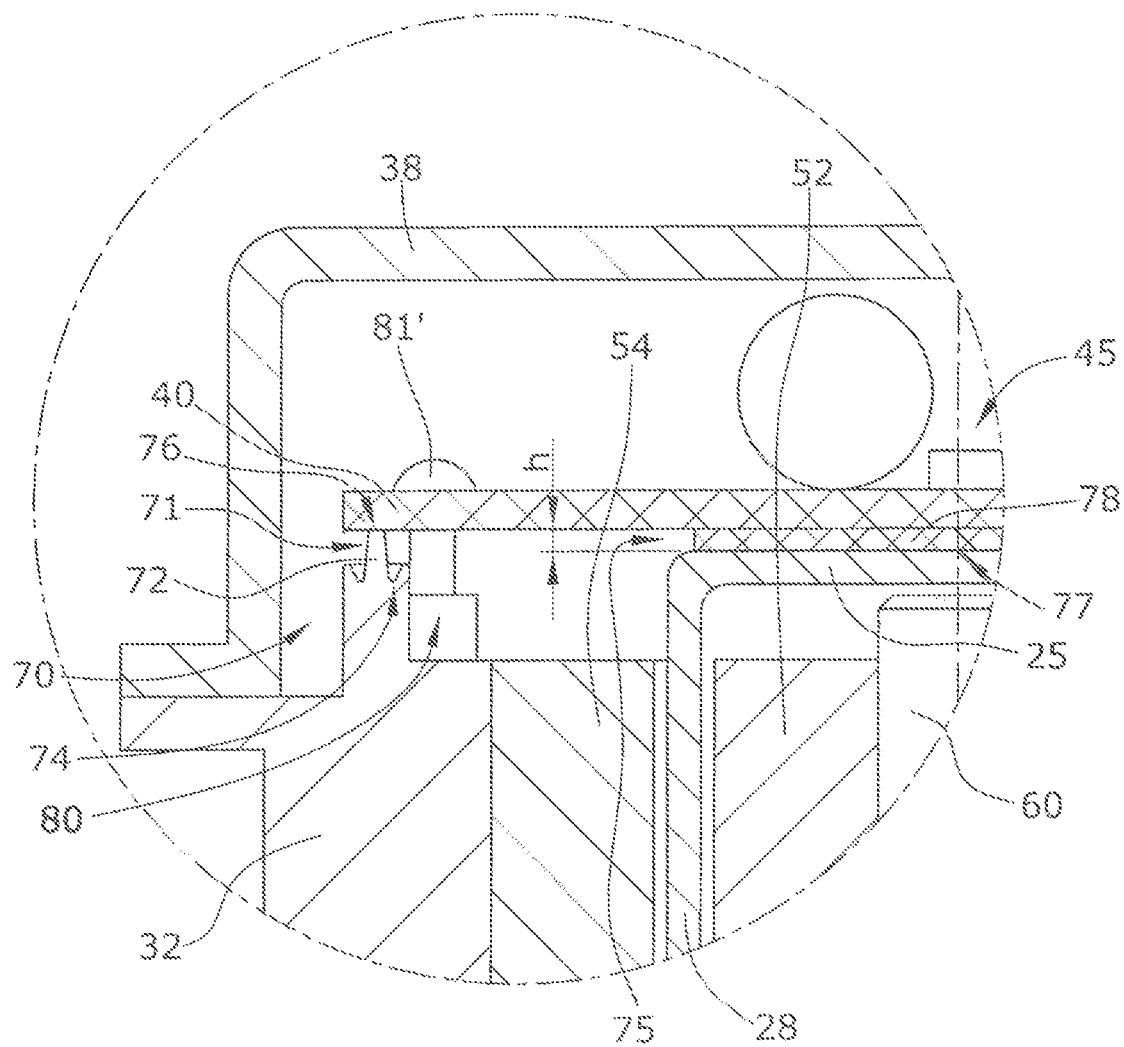
FIG. 2 shows an enlarged section of FIG. 1.

For electronically driving the brushless electric motor 50, the electric coolant pump 10 further comprises a disc-shaped printed circuit board 40 which is arranged concentrically and parallel to the separating can bottom wall 25. The printed circuit board 40 is axially supported by a number of axially extending height-adjusted supporting elements 70, as shown in FIGS. 1 and 2. Each supporting element 70 is defined by an arc shaped supporting element body 72 with an axial distal tip 71 and a collecting groove 74 surrounding the supporting element body 72. The arc of the arc-shaped supporting element body 72 is concentrically arranged to the separating can shell 28 and supports the printed circuit board 40 in its edge region. The supporting element body 72 is formed as an integral part of the plastic pump housing body 32. The supporting element body 72 is wedge-shaped so that it tapers distally in an axial direction. A plane supporting surface 76 is defined by trimming the distal tip 71 of the supporting element body 72 before mounting to axially support the printed circuit board 40.

Due to the trimming height of the supporting element body 72, a height constant axial gap 75 is defined between the separating can bottom wall 25 and the printed circuit board 40 with a nominal axial gap height h. The nominal axial gap height h can, for example, be less than 1.0 mm, for example, less than 0.8 mm. The ideal nominal axial gap height h in this embodiment of the electric coolant pump 10 is 0.5 mm. The height constant axial gap 75 is completely filled with a heat conductive paste 78 as a heat conductive means 77 to improve the heat transition between the printed circuit board 40 and the separating can bottom wall 25. The printed circuit board 40 is provided with power electronic components 45. The power electronic components 45 are arranged within the application zone of the heat conductive means at the opposite side of the printed circuit board 40 to allow a relatively high heat flow rate so as to transfer heat directly from the power electronic components 45 to the circulating coolant in the wet zone 12.

The electric coolant pump 10 comprises cylindrical positioning pins 80 for fixing the printed circuit board 40 in a radial direction and in an opposite axial direction of the supporting element 70. Each cylindrical positioning pin 80 extends in an axial direction and has a positioning pin head 81 at its distal end. The cylindrical positioning pins 80 reach through corresponding holes in the printed circuit board 40 so that the position of the printed circuit board 40 is thereby radially fixed. After mounting the printed circuit board 40 to the cylindrical positioning pins 80, the positioning pin heads 81 are thermally deformed so that the riveted positioning pin head 81' axially fixes the printed circuit board 40 in an opposite axial direction of the supporting element 70.

Figure 3:
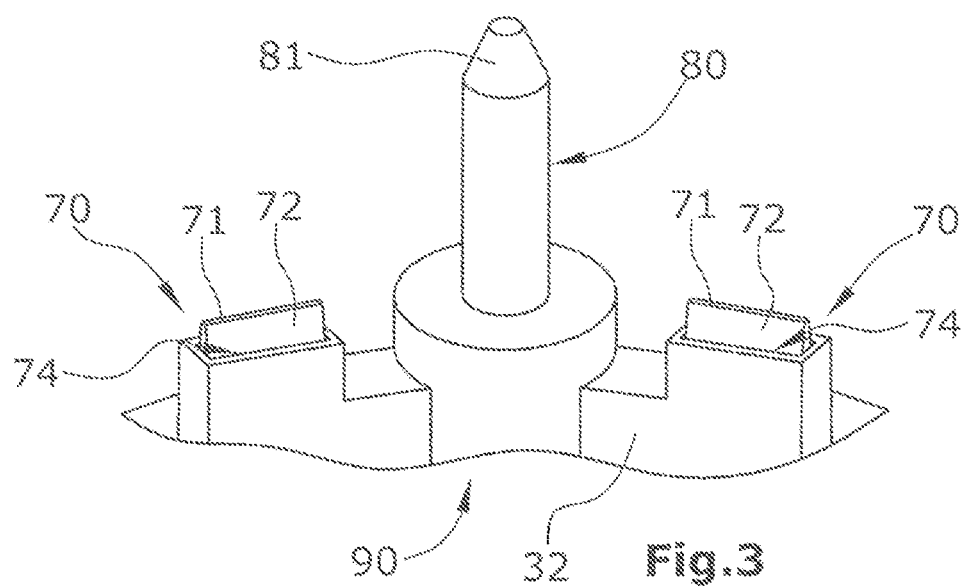
FIG. 3 shows an embodiment of a raw supporting element in a schematic perspective view.

FIG. 3 shows an embodiment of the supporting element 70 in a raw state before the distal tip 71 of the arc-shaped supporting element body 72 is trimmed. In this embodiment, two supporting elements 72 are arranged as a pair at both sides of a centric and cylindrical positioning pin 80 with a conical positioning pin head 81. The two supporting elements 70 are adjacent and equidistantly arranged to the centric cylindrical positioning pin 80. The supporting element 70 and the cylindrical positioning pin 80 thereby define an integrally molded mounting unit 90, which is an integral part of the plastic pump housing body 32. The mounting unit 90 is arranged concentrically to the separating can shell 28 in an arc-shaped arrangement to support and fix the printed circuit board 40 in the edge region of the printed circuit board 40. The supporting element body 72 is wedge-shaped and is surrounded by a collecting groove 74 for collecting melted material produced by thermally processing the distal tip 71 of the supporting element body 72.

The present invention is not limited to embodiments described herein; reference should be had to the appended claims.

LIST OF REFERENCE NUMERALS

10 Electric coolant pump
12 Wet zone
14 Dry zone
20 Separating can
25 Separating can bottom wall
26 Flange
28 Separating can shell
30 Pump housing
32 Plastic pump housing body
35 Pump cover
38 Motor cover
40 Printed circuit board
45 Power electronic components
50 Brushless electric motor
52 Motor rotor
54 Motor stator
60 Rotor shaft
62 Impeller wheel
70 Supporting element
71 Distal tip
72 Supporting element body
74 Collecting groove
75 Height constant axial gap
76 Plane supporting surface
77 Heat conductive means
78 Heat conductive paste
80 Cylindrical positioning pin
81 Positioning pin head
81' Riveted positioning pin head
90 Mounting unit
H Nominal axial gap height
II Enlarged section of FIG. 1 detailed in FIG. 2

What is claimed is:

1. A method for manufacturing an electric coolant pump which provides an automotive cooling circuit with a coolant, the electric coolant pump comprising:
   an electric motor which is configured to drive the electric coolant pump;
   a pump housing which is defined by a pump housing body;
   a separating can comprising a separating can bottom wall which is arranged to be substantially plane so as to lie in a cross plane, and a separating can shell which is arranged to be substantially cylindrical and which is configured to fluidically separate a wet zone from a dry zone within the pump housing of the electric coolant pump;
   a plane printed circuit board comprising electronic components for driving the electric motor, the plane printed circuit board being arranged substantially parallel to and not in direct contact with the separating can bottom wall so that an axial gap is defined between the separating can bottom wall and the plane printed circuit board, the axial gap being filled with a heat conductive means; and
   at least three supporting elements each of which are permanently height-adjusted, the at least three supporting elements being configured to axially support the plane printed circuit board, each of the at least three supporting elements comprising a distal tip which has been trimmed to define a height-constant axial gap having a nominal gap height between the plane printed circuit board and the separating can bottom wall, the at least three supporting elements each being defined by a supporting element body which is made of a plastic material,
   the method comprising:
   measuring an axial position of the separating can bottom wall in a pre-assembled state of the electric coolant pump where the plane printed circuit board is not mounted;
   trimming the supporting element body of the at least three supporting elements to adjust the nominal gap height in relation to a measured axial position of the separating can bottom wall; and
   assembling the plane printed circuit board to the supporting element body of the at least three supporting elements which have been trimmed,
   wherein,
   the supporting element of the at least three supporting elements is trimmed by machining a raw supporting element body.

2. The method for manufacturing the electric coolant pump as recited in claim 1, wherein the supporting element of the at least three supporting elements is trimmed by thermally processing the raw supporting element body.

3. A method for manufacturing an electric coolant pump which provides an automotive cooling circuit with a coolant, the electric coolant pump comprising:
   an electric motor which is configured to drive the electric coolant pump;
   a pump housing which is defined by a pump housing body;
   a separating can comprising a separating can bottom wall which is arranged to be substantially plane so as to lie in a cross plane, and a separating can shell which is arranged to be substantially cylindrical and which is configured to fluidically separate a wet zone from a dry zone within the pump housing of the electric coolant pump;
   a plane printed circuit board comprising electronic components for driving the electric motor, the plane printed circuit board being arranged substantially parallel to and not in direct contact with the separating can bottom wall so that an axial gap is defined between the separating can bottom wall and the plane printed circuit board, the axial gap being filled with a heat conductive means; and
   at least three supporting elements each of which are permanently height-adjusted, the at least three supporting elements being configured to axially support the plane printed circuit board, each of the at least three supporting elements comprising a distal tip which has been trimmed to define a height-constant axial gap having a nominal gap height between the plane printed circuit board and the separating can bottom wall, the at least three supporting elements each being defined by a supporting element body which is made of a plastic material, the method comprising:

measuring an axial position of the separating can bottom wall in a pre-assembled state of the electric coolant pump where the plane printed circuit board is not mounted;

trimming the supporting element body of the at least three supporting elements to adjust the nominal gap height in relation to a measured axial position of the separating can bottom wall; and assembling the plane printed circuit board to the supporting element body of the at least three supporting elements which have been trimmed, wherein, the trimming results in a material removal of every supporting element body of at least 0.1 mm.

4. The method for manufacturing the electric coolant pump as recited in claim 3, wherein, prior to assembling the plane printed circuit board to the supporting element body of the at least three supporting elements which have been trimmed, the method further comprises:

providing the heat conductive means at the separating can bottom wall or at the plane printed circuit board.

* * * * *